United States Patent
Bonardi et al.

(10) Patent No.: US 6,362,761 B1
(45) Date of Patent: Mar. 26, 2002

(54) EFFICIENT SWITCHED CAPACITOR INTEGRATOR

(75) Inventors: Felice Bonardi, Milan; Marco Angelici, Galliate Lombardo, both of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/527,737

(22) Filed: Mar. 17, 2000

(30) Foreign Application Priority Data

Mar. 19, 1999 (IT) ......................... VA99A0007

(51) Int. Cl.$^7$ ............................................. H03M 3/00
(52) U.S. Cl. ................................. 341/143; 375/247
(58) Field of Search .......................... 341/143, 172, 341/155, 144, 76; 375/247; 330/107

(56) References Cited

U.S. PATENT DOCUMENTS 4,599,573 A * 7/1986 Senderowicz ............... 330/107
5,727,024 A * 3/1998 Hauptmann ................. 375/247
6,184,811 B1 * 2/2001 Nagari et al. ............... 341/143

* cited by examiner

Primary Examiner—Peguy JeanPierre
Assistant Examiner—Joseph Lauture
(74) Attorney, Agent, or Firm—Lisa K. Jorgenson; Allen, Dyer, Doppelt, Milbrath & Gilchrist, P.A.

(57) ABSTRACT

A switched capacitor integrator particularly suitable to realize low-pass filters without inducing noise on the nodes of the reference potentials of the integrator, is provided by halving the input capacitance during an operating phase, and by transferring the electric charge between the input switched capacitance and the capacitor of integration of one and the other feedback branch of the differential amplifier, in a direct manner, that is, not referred to a fixed common potential. A unique current path is established, thus averting the effects caused by inevitable mismatches between the integrated capacitors.

16 Claims, 7 Drawing Sheets

EFFICIENT SWITCHED CAPACITOR INTEGRATOR

FIELD OF THE INVENTION

The present invention relates to interfaces, and, more particularly, to Digital/Analog (D/A) and Analog/Digital (A/D) conversions.

BACKGROUND OF THE INVENTION

D/A and A/D conversions are important interface processes that find applications in telecommunication, audio systems, instrumentation and the like. These processes continuously demand highly precise filters, such as the switched capacitor filters whose basic element is the integrator. Therefore, a particularly efficient integrator may be very useful for the above-cited applications.

By way of example, consider the application of a sigma-delta ($\Sigma\Delta$)D/A converter for low-pass signals whose basic scheme is as shown in FIG. 1. In these types of converters, the $\Sigma\Delta$ modulator converts an N bit digital signal into a 1-bit signal, shifting the quantization noise thus introduced outside the signal band. The low-pass analog filter would then eliminate this noise. The purpose of a 1-bit DAC is to form the interface between the digital world, represented by the bit-stream output delivered by the modulator, and the analog world, represented by the switched capacitor low-pass filter.

FIG. 2 shows the output of the 1-bit DAC in detail. Specifically, FIG. 2 shows how the energy that corresponds to the logic level 1 is different from the one that corresponds to the level 0. The figure also shows how the energy of two consecutive 1s is different from the energy that may be obtained by adding two nonconsecutive 1s. For these reasons, switched capacitor filters are preferred because what is considered important is the value assumed by the signal of FIG. 2 at a specific instant.

FIG. 2 also shows the effect in time of unwanted noise, as generated by the voltage references $V_h$ $V_l$, that becomes superimposed on the useful signal. In frequency, the high frequency noise contained in the input signal is eventually folded back in the band, thus determining a notable degradation of the total signal/noise ratio, as shown in FIG. 3. The effect of folding back the noise inside the band is even more evident as the noise that superimposes the signal, delivered as output by the 1-bit DAC, depends on the bit-stream. Indeed, the expression for the filter's output voltage is given by:

$$V_{OUT} = V_{ref} \cdot \frac{K}{2^N - 1} \cdot \alpha(K) + C \quad (1)$$

where:

K:input word to the DAC ($0 \leq K \leq 2^N-1$);

N:number of bits of the converter;

C:constant that allow the curve to be translated;

$\alpha(K)$:variable, K dependent, which expresses the perfect linearity of the converter;

$V_{ref} V_h-V_l$: reference voltage.

Equation 1 demonstrates that the existence of a nonlinearity introduces a multiplying factor of $V_{ref}$, thus causing a distortion effect.

In the case of a 1 bit converter (N=1) shown in FIG. 1, the system is always linear ($\alpha(K)=1 \forall K$) as long as $V_{ref}$ is perfectly stable and free of components whose frequency is different from 0. If this were not the case, such components would modulate the spectrum components of the input signal, thus determining a distortion effect.

Hence, there is a need for an efficient switched capacitor integrator structure, which permits the realization of the desired filters without introducing excessive and undesired noises on the reference voltages $V_h$ e $V_l$.

The 1-bit DAC is often directly integrated inside the following switch capacitor filter, especially for those applications to be integrated on a single chip. Since the integrator is usually the basic element of a filter, there exist different structures that permit the 1-bit DAC to link to the integrator itself. Depicted in FIG. 4 is a conventional structure of a switched capacitor integrator with a stray-insensitive connection of the input capacitance $C_{11}$.

FIG. 5 shows a known evolution of the integrator of FIG. 4, which doubles the dynamic of the output signal by using a fully differential structure. The capacitances $C_a$, $C_b$, $C_c$ and $C_d$ represent the parasitic capacitances of the capacitors $C_1$ and $C_{11}$, realized on the silicon. Typically, one of these two parasitic capacitances is much bigger than the other because the distance between one of the two plates and the substrate connected to ground is shorter.

By putting $V_{din}=2 \cdot (V_h-V_l)$, we have:

$$V_{dout}(n) = V_{dout}(n-1) - \frac{C_{11} + C_b/2}{C_1} \cdot V_{din}(n-1) \cdot (-1)^K \quad (2)$$

where K=1 with bs=1 and K=0 with bs=0 (bs is the bit-stream).

Equation 2 is obtained upon considering the components of the circuit of FIG. 5 as ideal components, with the exception of the capacitors to which are associated parasitic capacitances. In addition, the operational amplifier should be able to maintain the mean value of the outputs to a constant value in time. Furthermore, by indicating the asymptotic voltage on the input nodes of the operational amplifier as $V_x(\infty)$ we have:

$$V_x(\infty) = \frac{2 \cdot C_{11} \cdot V_{com} + (V_h + V_l) \cdot C_b}{2 \cdot (C_{11} + C_b)} \quad (3)$$

Equation 2 and Equation 3 emphasize the need to minimize the capacitance $C_b$, while the other parasitic capacitances are not involved, with the exception of $C_c$ which contributes in determining the time required by the system to obtain $V_x=V_x(\infty)$.

The fundamental problem of these approaches is that the capacitive load on the reference voltages $V_h$ e $V_l$ depends on the bit-stream; a condition that may introduce undesired distortion effects.

The scheme of FIG. 6 was developed to avert this problem. This approach permits a constant load on the voltages $V_h$ and $V_l$, regardless of the bit-stream value. The functioning characteristics of this modified scheme are identical to the ones shown in the scheme of FIG. 5.

SUMMARY OF THE INVENTION

A switched capacitance integrator has now been devised which is particularly more efficient and suitable to realize filters without introducing significant noises on the nodes of the reference potentials of the integrator.

As compared to an earlier approach, e.g. identifiable in a scheme as the one shown in FIG. 6, the fundamental aspect of the present invention includes halving the whole input capacitance to be charged during an operating phase, and in carrying out the transfer of electric charge between the input switched capacitor and the capacitor of integration of one and the other feedback branch of the operational amplifier in a direct manner, that is, not referred to a common fixed potential as it is the case of known circuits. This reduces the strain on the operational a amplifier because the current delivered through an output node in order to discharge a capacitor is identical to the current delivered through the other output node that charges the other capacitor. Hence, there exists a unique current path, thus averting the effects caused by eventual mismatches between capacitances, unlike what happen in the known circuits of FIGS. 5 and 6 in which the current path involves all four capacitors, that is, the pair of input capacitors and the pair of capacitors of integration, thus increasing the problems generated by the capacitive mismatch.

DETAILED DESCRIPTION OF THE PREFERRED EMBODIMENTS

Figure 6:
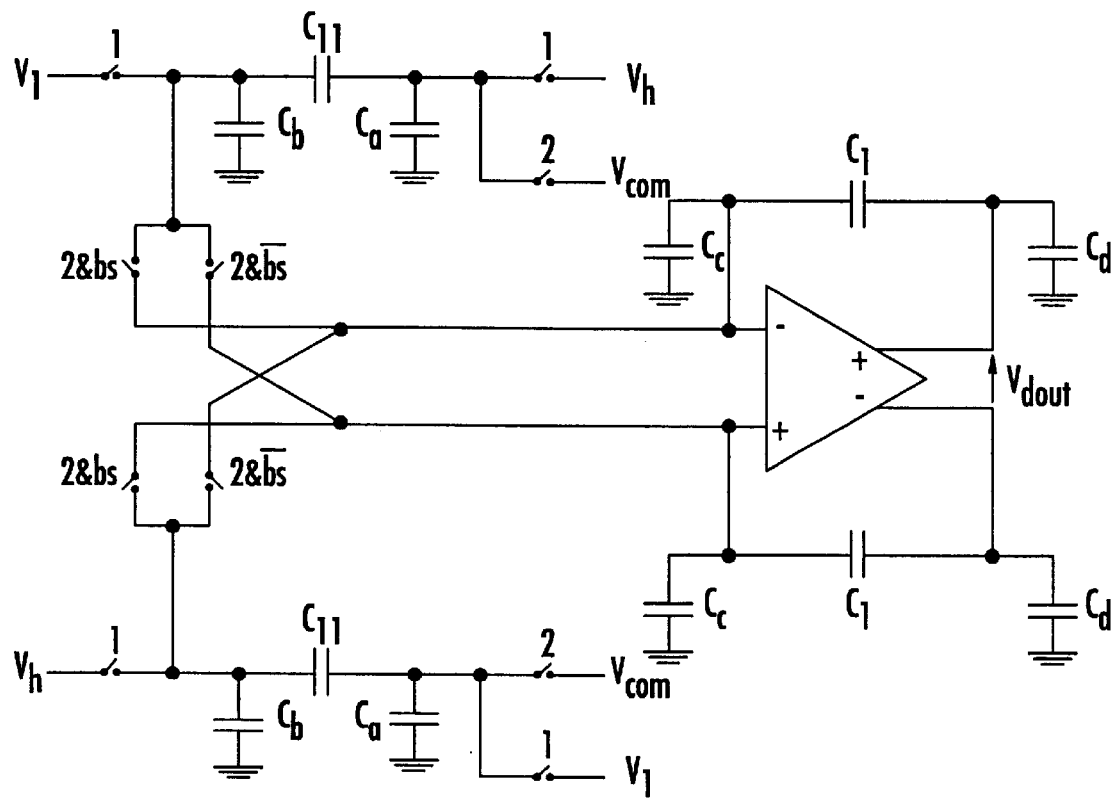
FIG. 6 shows another known structure of a differential integrator with a 1-bit DAC differential integrator.
Figure 7:
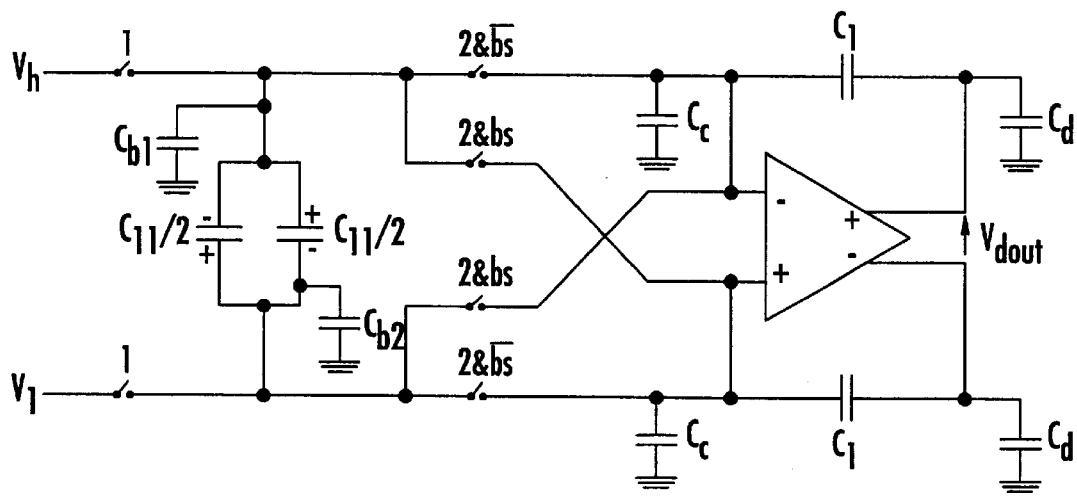
FIG. 7 shows the structure of a fully differential integrator with a 1-bit DAC in accordance with the present invention.

As in the example of the known structure of FIG. 6, the structure of the invention illustrated in FIG. 7 allows for a load on the two nodes of the reference voltages $V_h$ and $V_l$ regardless of the bit-stream. The ensuing description outlines the further advantages of the present invention.

During the phase 1, the input capacitance $C_{11}$ of the circuit of the invention shown in FIG. 7 is charged. $C_{11}$ is realized in an integrated form through two capacitors whose capacitance value is halved $C_{11}/2$, preferably with plates that are directly opposite each other in order to have equal parasitic capacitances on $V_h$ and $V_l$. The input capacitance $C_{11}$ is discharged during the successive phase through the two virtual grounds of the operational amplifier, that is, the inverting input (−) and the noninverting input (+).

Figure 1:
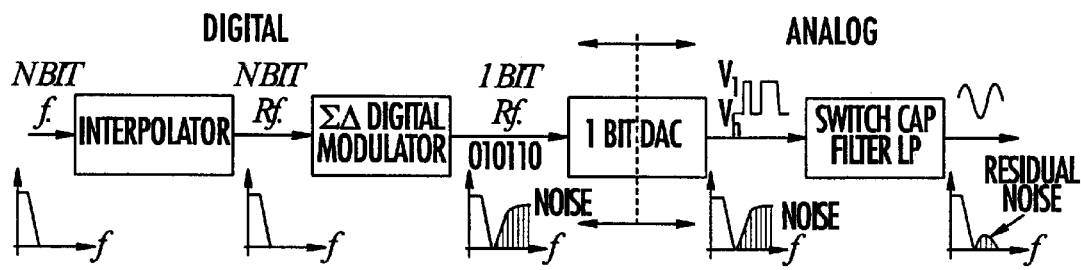
FIG. 1, as already mentioned is a basic scheme of a D-A D converter.
Figure 2:
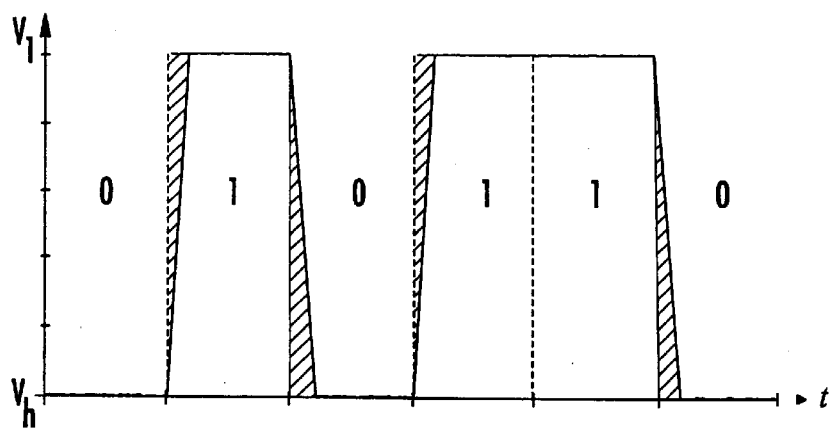
FIG. 2 shows the form of the output signal of the 1-bit DAC converter.
Figure 3:
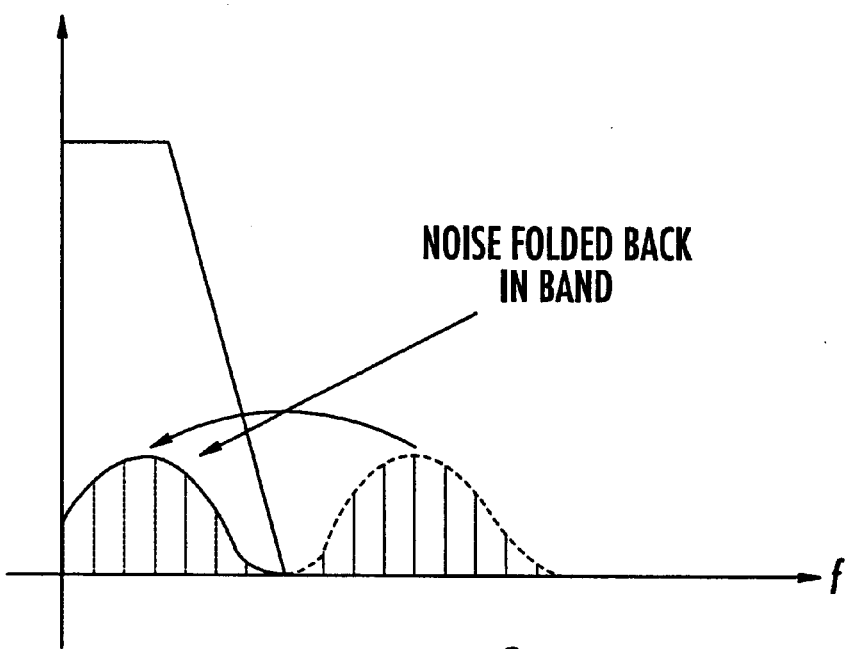
FIG. 3 shows the spectrum that the converter delivers as output in the presence of noises on the nodes of the reference potentials, dependent on the bit-stream.
Figure 4:
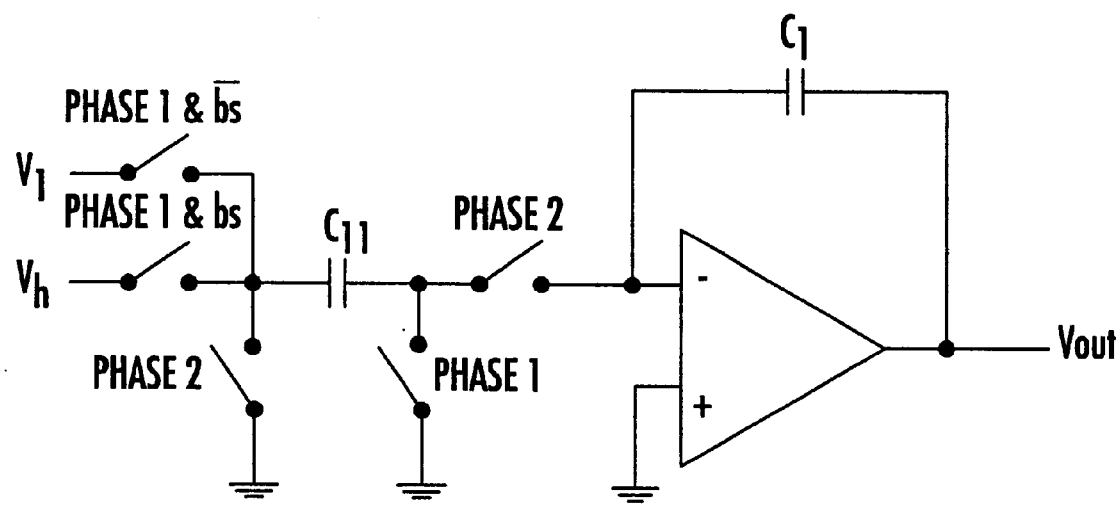
FIG. 4 shows the conventional scheme of a switched capacitor integrator using a 1-bit DAC converter.
Figure 5:
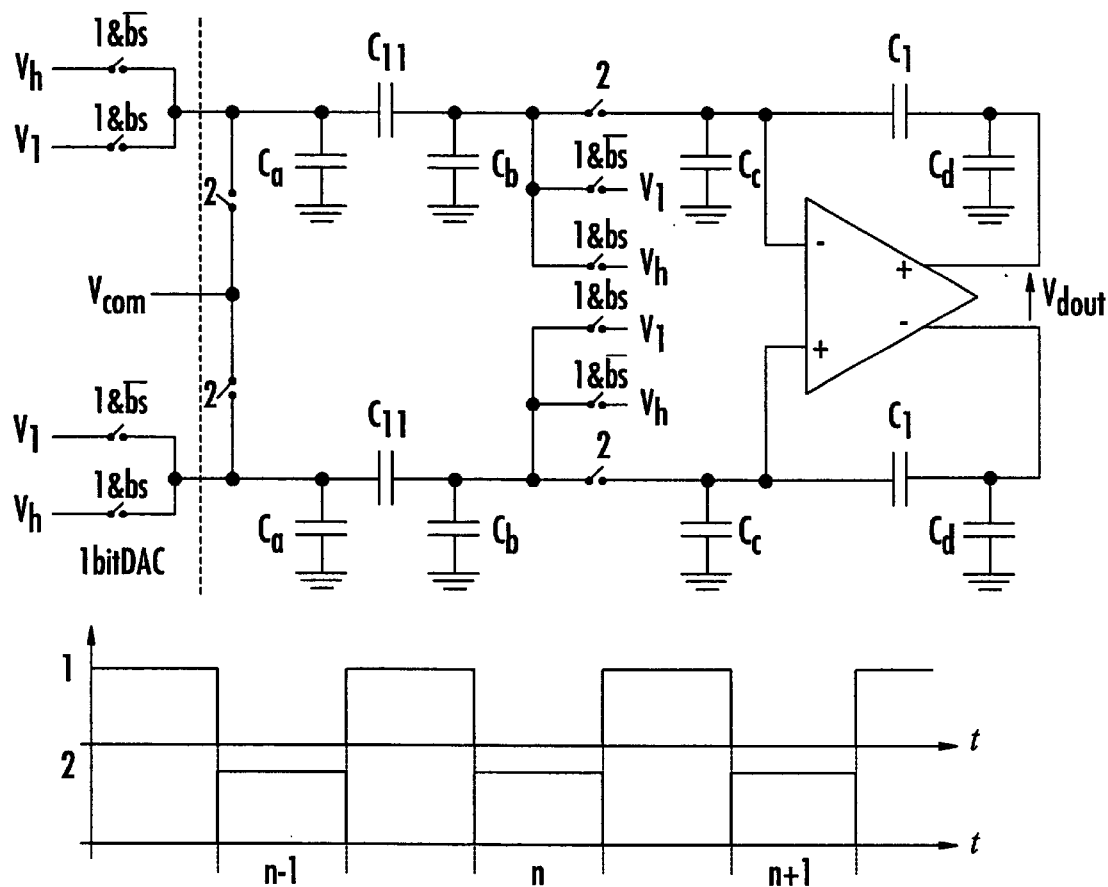
FIG. 5 shows a known embodiment of a fully differential integrator using a 1-bit DAC converter.

As compared to the known circuits of FIGS. 5 and 6, the first advantage includes halving the total capacitance to be charged during the phase 1. Indeed, in FIGS. 5 and 6, two $C_{11}$ capacitances should be charged whereas the circuit of the invention requires the charge of two $C_{11}/2$ capacitances. This condition reduces the strain on the nodes of the two reference voltages $V_h$ and $V_l$, thus reducing the probability of introducing distortion effects. Moreover, the decrease of the integrated capacitance results in a non-negligible reduction of silicon area.

Unlike the two known schemes of FIGS. 5 and 6, the transfer of the electric charge between the capacitances $C_{11}$ and $C_1$ occurs in a direct manner rather than through the fixed common potential $V_{com}$. In substance, the charge removed from the input capacitance $C_{11}$ is absorbed by one of the capacitors of integration $C_1$ and thereafter transferred on the other one through a unique current path. This lessens the strain on the operational amplifier because the current supplied by an output clamp in order to discharge the capacitance of integration $C_1$, is identical to the current that charges the other capacitance of integration $C_1$ through the other output clamp. As a result, there exists a unique path $C_1 \Rightarrow C_{11} \Rightarrow C_1$ through which the charge flows, thus limiting the effects caused by any mismatch that may exist among the capacitors.

Instead, in the cases shown in FIG. 5 and FIG. 6 the charging path involves all four capacitances, which is a condition that increases the problems caused by the additional mismatch of the two input capacitors $C_{11}$.

A further advantage of the approach of the present invention is the augmented speed because the feedback moves toward opposite directions both input potentials of the operational amplifier (immediately after the switches of phase 2 are closed), thus discharging more rapidly the double capacitance $C_{11}/2$.

Figure 8A:
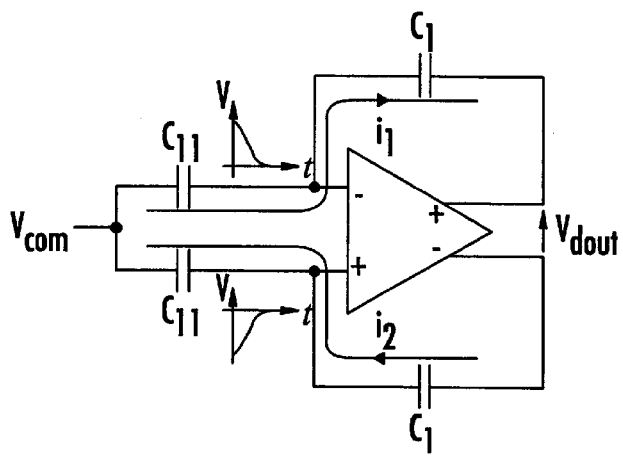
FIG. 8a and FIG. 8b compare the functional scheme of a known structure with the functional scheme of the structure of the invention, during the phase of integration.
Figure 8B:
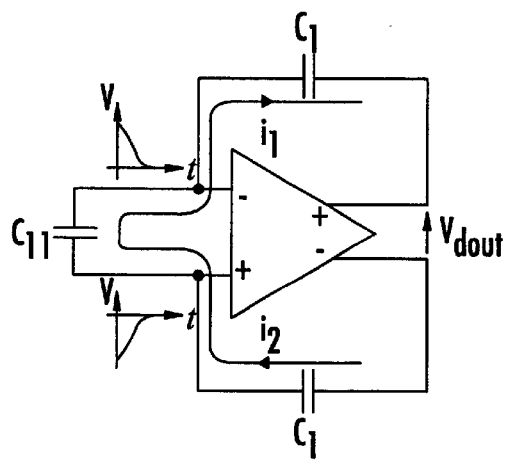

Further clarification of the present invention will be discussed while referring to FIGS. 8a and 8b which are relative to the instant that follows the start of the second phase of integration. These figures compare the known system (FIG. 8a) with the scheme of the invention (FIG. 8b). Under the hypothesis that an ideal components situation exists, with the exception of the capacitors, the fundamental relationships that rule the scheme of FIG. 7 are:

$$V_{dout}(n) = \qquad (4)$$

$$V_{dout}(n-1) + \frac{-V_{din} \cdot C_{11} \cdot (-1)^K + V_X(n) \cdot (C_{b1} - C_{b2}) + f(K)}{C_I}$$

where $$f(K) = \begin{cases} -C_{b2} \cdot V_l + C_{b1} \cdot V_h & \text{if } K = 1 \\ -C_{b2} \cdot V_h + C_{b1} \cdot V_l & \text{if } K = 0 \end{cases}$$

From Equation 4 the importance of $C_{b1}=C_{b2}$ is evident.

For this reason, the capacitance $C_{11}$ of FIG. 7 is obtained with two integrated capacitors $C_{11}/2$ crossing one another. In this way $C_{b1}$ and $Cb_2$ would be certainly identical. However, unlike the other two schemes considered, it is not possible in this case to connect the smaller parasitic capacitance to the inputs of the operational amplifier in order to minimize its effect, because there will be two identical parasitic capacitances, equal to the sum of the two parasitic capacitances of the respective $C_{11}/2$. This disadvantage is less than what it may seem because the capacitances are halved and the parasitic capacitances are also reduced.

By considering a common mode condition in which the output is kept at a value $V_{com}$, and by indicating the parasitic capacitances as $\overline{C}_b=C_{b1}=C_{b2}$ and upon substituting in Equation 4, we have:

$$V_{dout}(n) = V_{dout}(n-1) - \frac{C_{11} + \overline{C}_b/2}{C_1} \cdot V_{din} \cdot (-1)^k \quad (5)$$

In addition, we also have:

$$V_x(\infty) = \frac{V_h + V_l}{2} \quad (6)$$

From equation 6 it may be noticed that none of the capacitances has any role in determining the asymptotic value of the inputs of the operational amplifier, which is purely fixed by the reference voltages $V_h$ and $V_l$.

Figure 9A:
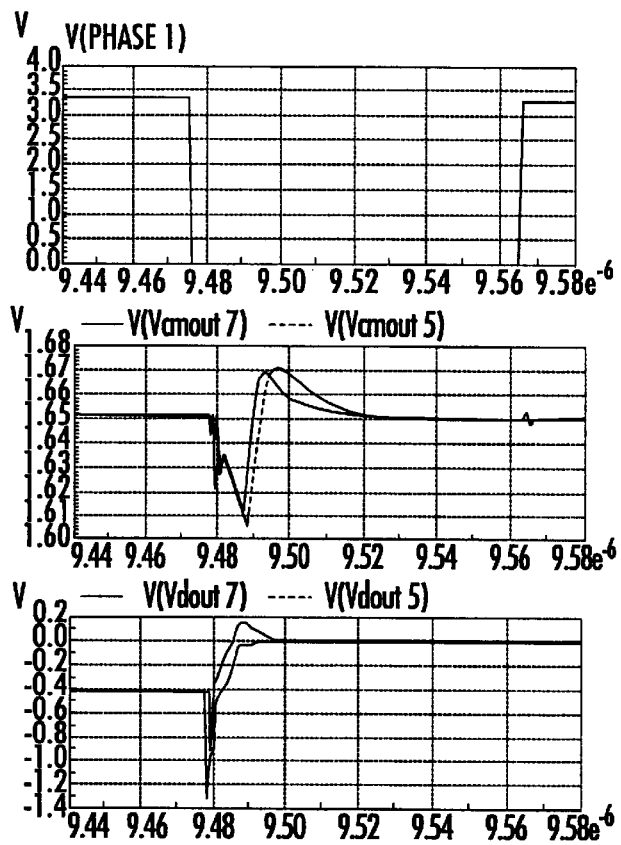
FIG. 9 shows the functioning diagrams of a known structure of FIG. 5 as well as a structure of the invention of FIG. 7 intended for three different functioning conditions.
Figure 9B:
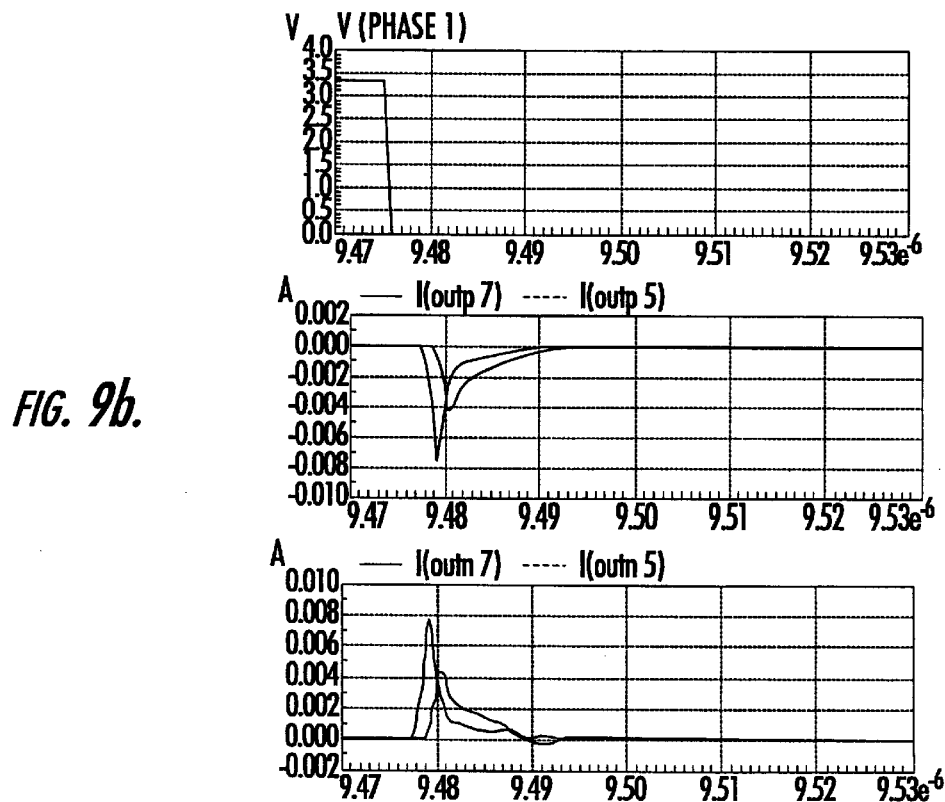
Figure 9C:
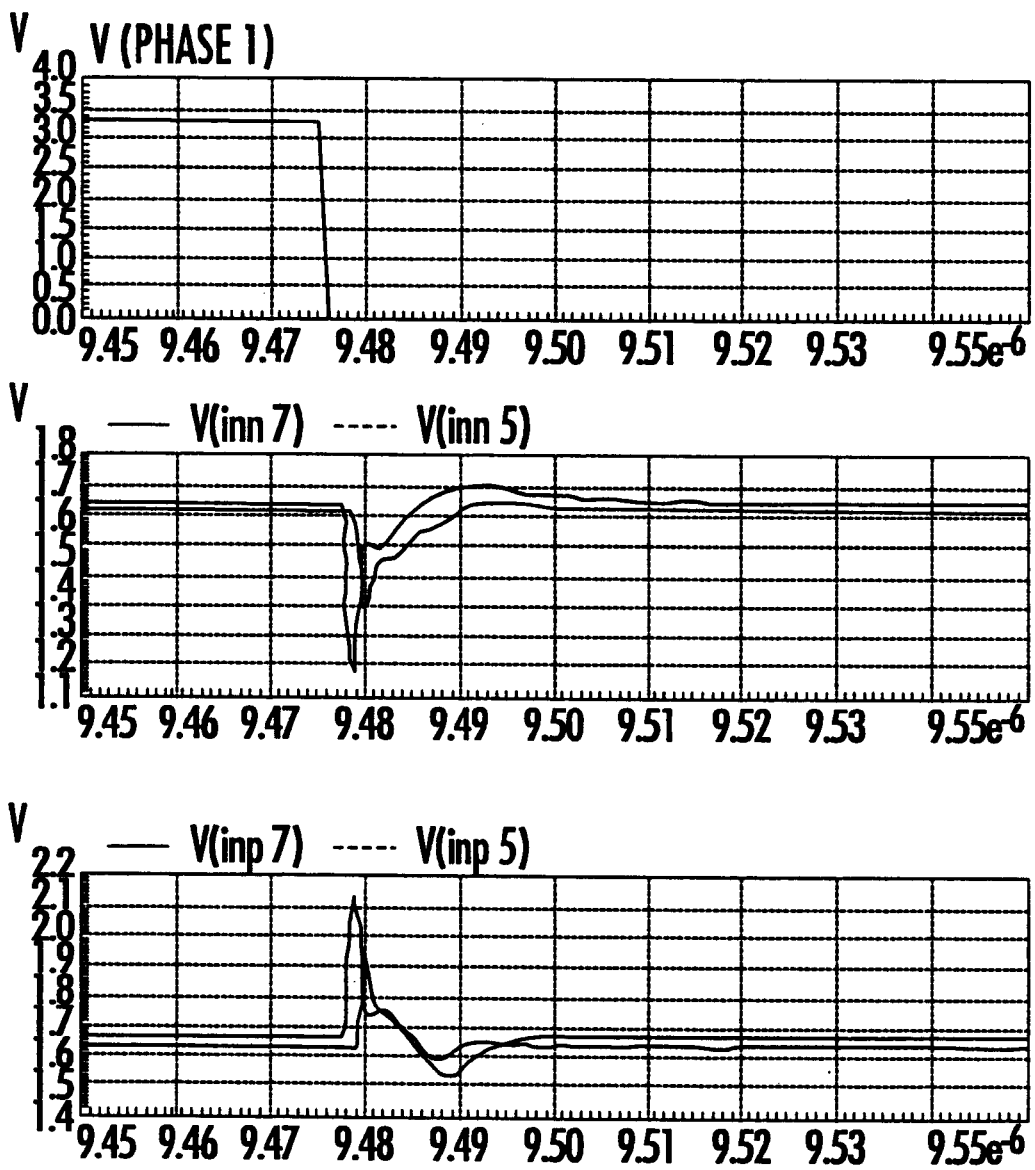

By analyzing the effect of an eventual unwanted noise existing on the reference voltages $V_h$, $V_l$ and $V_{com}$, the three circuits being analyzed do not present any differences. By way of example, the circuits described in FIG. 5 and FIG. 7 have been simulated in order to test the above description. The results are shown in FIG. 9 in which the common mode of the output of the circuit shown in FIG. 7 is faster than the one of FIG. 5.

In addition, the differential signal of the circuit of the invention reaches the steady state value in a shorter time span than the other schemes considered. FIG. 9 also highlights that in the circuit of the invention there is a reduction of the current supplied by the operational, and the inputs of the operational amplifier are less perturbed.

That which is claimed is:

1. An integrated switched capacitor fully differential integrator comprising:
    an input interface comprising a 1-bit Digital/Analog converter and an input capacitance connected to the 1-bit Digital/Analog converter to be charged, during a first switching phase, alternatively to a first logic high reference voltage and to a second logic low reference voltage in reference to a common potential;
    an operational amplifier configured as an integrator with a differential output having first and second integrating capacitors with identical capacitances and respectively connected between a noninverted output and an inverting input and between an inverted output and an noninverting input; and
    a switch for transferring the charge of the input capacitance charged to the first reference voltage to the first integrating capacitor through the noninverted output of the operational amplifier and for transferring the charge of the input capacitance charged to the second reference voltage to the second integrating capacitor through the inverted output of the operational amplifier, during a second switching phase;
    wherein the input capacitance comprises two integrated capacitors of halved capacitance, and the switch comprises a first current path of transfer of the charge from the input capacitance to the first integrating capacitor and a second current path of transfer of the charge from the second integrating capacitor to the input capacitance, while keeping the respective currents of the noninverted output and of the inverted output of the operational amplifier substantially identical.

2. The integrator according to claim 1, wherein each of the integrated capacitors and integrating capacitors comprises patterned superimposed polysilicon layers or metal layers isolated by a dielectric layer.

3. A sigma-delta ($\Sigma\Delta$) Digital/Analog converter comprising:
    a first digital circuit section comprising
        an input interpolator, and
        a $\Sigma\Delta$ modulator connected to the output of the interpolator; and
    an analog circuit section comprising a switched capacitor low-pass filter which is an integrator comprising
        an input interface comprising a 1-bit Digital/Analog converter and an input capacitance connected to the 1-bit Digital/Analog converter to be charged, during a first switching phase, alternatively to a first logic high reference voltage and to a second logic low reference voltage in reference to a common potential,
        an operational amplifier configured as an integrator with a differential output having first and second integrating capacitors with identical capacitances and respectively connected between a noninverted output and an inverting input and between an inverted output and an noninverting input, and
        a switch for transferring the charge of the input capacitance charged to the first reference voltage to the first integrating capacitor through the noninverted output of the operational amplifier and for transferring the charge of the input capacitance charged to the second reference voltage to the second integrating capacitor through the inverted output of the operational amplifier, during a second switching phase,
        wherein the input capacitance comprises two integrated capacitors of halved capacitance, and the switch comprises a first current path of transfer of the charge from the input capacitance to the first integrating capacitor and a second current path of transfer of the charge from the second integrating capacitor to the input capacitance, while keeping the respective currents of the noninverted output and of the inverted output of the operational amplifier substantially identical;
    an output of the $\Sigma\Delta$ modulator being connected to an input of the input interface.

4. The converter according to claim 3, wherein each of the integrated capacitors and integrating capacitors comprises patterned superimposed polysilicon layers or metal layers isolated by a dielectric layer.

5. A switched capacitor integrator comprising:
    a 1-bit Digital/Analog converter and a plurality of input capacitors connected in parallel and defining an input capacitance, and connected to the 1-bit Digital/Analog converter to be charged alternatively to a first logic high reference voltage and to a second logic low reference voltage in reference to a common potential;
    an operational amplifier configured as an integrator with a differential output having first and second integrating capacitors with substantially identical capacitances and respectively connected between a noninverted output and an inverting input and between an inverted output and an noninverting input; and
    a switch for transferring the charge of the input capacitance charged to the first reference voltage via a first path to the first integrating capacitor through the noninverted output of the operational amplifier and for transferring the charge of the input capacitance charged to the second reference voltage via a second path to the second integrating capacitor through the inverted output of the operational amplifier, while keeping respective currents of the noninverted output and of the inverted output of the operational amplifier substantially identical.

6. The integrator according to claim 5, wherein the plurality of input capacitors comprises two capacitors each defining half the input capacitance.

7. The integrator according to claim 5, wherein each of the input capacitors and integrating capacitors comprises patterned superimposed polysilicon layers or metal layers isolated by a dielectric layer.

8. A sigma-delta (ΣΔ) Digital/Analog converter comprising:
   a first digital circuit section comprising
      an input interpolator, and
      a ΣΔ modulator connected to the output of the interpolator; and
   an analog circuit section comprising a switched capacitor low-pass filter which is an integrator comprising
      a 1-bit Digital/Analog converter and a plurality of input capacitors connected in parallel and defining an input capacitance, and connected to the 1-bit Digital/Analog converter to be charged alternatively to a first logic high reference voltage and to a second logic low reference voltage in reference to a common potential,
      an operational amplifier configured as an integrator with a differential output having first and second integrating capacitors with substantially identical capacitances and respectively connected between a noninverted output and an inverting input and between an inverted output and an noninverting input, and
      a switch for transferring the charge of the input capacitance charged to the first reference voltage via a first path to the first integrating capacitor through the noninverted output of the operational amplifier and for transferring the charge of the input capacitance charged to the second reference voltage via a second path to the second integrating capacitor through the inverted output of the operational amplifier, while keeping respective currents of the noninverted output and of the inverted output of the operational amplifier substantially identical;
   an output of the ΣΔ modulator being connected to an input of the 1-bit Digital/Analog converter.

9. The converter according to claim 8, wherein the plurality of input capacitors comprises two capacitors each defining half the input capacitance.

10. The converter according to claim 8, wherein each of the input capacitors and integrating capacitors comprises patterned superimposed polysilicon layers or metal layers isolated by a dielectric layer.

11. A method of making a switched capacitor integrator, comprising:
   providing a 1-bit Digital/Analog converter having a plurality of input capacitors connected in parallel, which define an input capacitance, to be charged alternatively to a first logic high reference voltage and to a second logic low reference voltage in reference to a common potential;
   providing an operational amplifier configured as an integrator with a differential output having first and second integrating capacitors with substantially identical capacitances and respectively connected between a noninverted output and an inverting input and between an inverted output and an noninverting input; and
   connecting a switch between the 1-bit Digital/Analog converter and the operational amplifier to transfer the charge of the input capacitance charged to the first reference voltage via a first path to the first integrating capacitor through the noninverted output of the operational amplifier and to transfer the charge of the input capacitance charged to the second reference voltage via a second path to the second integrating capacitor through the inverted output of the operational amplifier, while keeping respective currents of the noninverted output and of the inverted output of the operational amplifier substantially identical.

12. The method according to claim 11, wherein the plurality of input capacitors comprises two capacitors each defining half the input capacitance.

13. The method according to claim 11, wherein each of the input capacitors and integrating capacitors is formed by patterning superimposed polysilicon layers or metal layers isolated by a dielectric layer.

14. A method of making a sigma-delta (ΣΔ) Digital/Analog converter, comprising:
   providing a first digital circuit section comprising an input interpolator, and a ΣΔ modulator connected to the output of the interpolator;
   providing an analog circuit section comprising a switched capacitor low-pass filter which is an integrator comprising
      a 1-bit Digital/Analog converter and a plurality of input capacitors connected in parallel and defining an input capacitance, and connected to the 1-bit Digital/Analog converter to be charged alternatively to a first logic high reference voltage and to a second logic low reference voltage in reference to a common potential,
      an operational amplifier configured as an integrator with a differential output having first and second integrating capacitors with substantially identical capacitances and respectively connected between a noninverted output and an inverting input and between an inverted output and an noninverting input, and
      a switch for transferring the charge of the input capacitance charged to the first reference voltage via a first path to the first integrating capacitor through the noninverted output of the operational amplifier and for transferring the charge of the input capacitance charged to the second reference voltage via a second path to the second integrating capacitor through the inverted output of the operational amplifier, while keeping respective currents of the noninverted output and of the inverted output of the operational amplifier substantially identical;
   connecting an output of the ΣΔ modulator to an input of the 1-bit Digital/Analog converter.

15. The method according to claim 14, wherein the plurality of input capacitors comprises two capacitors each defining half the input capacitance.

16. The method according to claim 14, wherein each of the input capacitors and integrating capacitors is formed by patterning superimposed polysilicon layers or metal layers isolated by a dielectric layer.

* * * * *

UNITED STATES PATENT AND TRADEMARK OFFICE
CERTIFICATE OF CORRECTION

PATENT NO. : 6,362,761 B1
DATED : March 26, 2002
INVENTOR(S) : Felice Bonardi and Marco Angelici It is certified that error appears in the above-identified patent and that said Letters Patent is hereby corrected as shown below:

<u>Title page,</u>
Item [73], delete "STMicroelectronics S.R.L." insert -- STMicroelectronics S.r.l. --

<u>Column 1,</u>
Line 60, delete "$V_{ref}V_h-V_1$:" insert -- $V_{ref} \propto V_h-V_1$: --

<u>Column 3,</u>
Line 5, delete "operational a amplifier" insert -- operational amplifier --
Line 19, delete "D converter" insert -- $\Sigma\Delta$ converter --

<u>Column 5,</u>
Line 27, delete "the operational, and" insert -- the operational amplifier, and --

Signed and Sealed this

First Day of October, 2002

Attest:

JAMES E. ROGAN
*Attesting Officer*     *Director of the United States Patent and Trademark Office*